(12) United States Patent
Asada

(10) Patent No.: US 10,795,406 B2
(45) Date of Patent: Oct. 6, 2020

(54) WORK DEVICE AND TIME-MEASURING METHOD OF WORK DEVICE

(71) Applicant: FUJI CORPORATION, Chiryu (JP)

(72) Inventor: Kazuhiro Asada, Tokai (JP)

(73) Assignee: FUJI CORPORATION, Chiryu (JP)

( * ) Notice: Subject to any disclaimer, the term of this patent is extended or adjusted under 35 U.S.C. 154(b) by 86 days.

(21) Appl. No.: 16/319,864

(22) PCT Filed: Jul. 28, 2016

(86) PCT No.: PCT/JP2016/072120
§ 371 (c)(1),
(2) Date: Jan. 23, 2019

(87) PCT Pub. No.: WO2018/020632
PCT Pub. Date: Feb. 1, 2018

(65) Prior Publication Data
US 2019/0265749 A1    Aug. 29, 2019

(51) Int. Cl.
*G06F 1/14* (2006.01)
*G06F 13/40* (2006.01)
(Continued)

(52) U.S. Cl.
CPC .............. *G06F 1/14* (2013.01); *G05B 19/418* (2013.01); *G06F 11/3024* (2013.01);
(Continued)

(58) Field of Classification Search
CPC ........ G06F 1/14; G06F 11/30; G06F 11/3024; G06F 11/3466; G06F 11/3476;
(Continued)

(56) References Cited

U.S. PATENT DOCUMENTS 5,673,194 A    9/1997  Cipelletti et al.
7,362,740 B2 *  4/2008  Fredriksson .............. G06F 1/14
                                                      370/345
(Continued)

FOREIGN PATENT DOCUMENTS

EP    0 652 539 A1    5/1995
EP    1 196 830       4/2002
(Continued)

OTHER PUBLICATIONS

International Search Report dated Oct. 11, 2016, in PCT/JP2016/072120, filed Jul. 28, 2016.

*Primary Examiner* — Crystal J Barnes-Bullock
(74) *Attorney, Agent, or Firm* — Oblon, McClelland, Maier & Neustadt, L.L.P.

(57) ABSTRACT

In the case where multiple individual work devices respectively executing a sequence of multiple tasks are controlled in an integrated manner by an integrated control device, log analysis among the multiple individual work devices is difficult. One of four individual work devices transmits time inquiry signal to main integrated control device via serial communication cable. Main integrated control device returns the time at time at which time inquiry signal was received to the one of four individual work devices to which time inquiry signal was transmitted. One of four individual work devices receives a reply from main integrated control device at time, adds the communication time to the time at time, and calculates the time at time. One of four individual work devices starts the calculation of the in-device time from calculated time as a starting point. One of four individual work devices logs based on in-device time.

6 Claims, 7 Drawing Sheets

(51) Int. Cl.
  *H05K 13/08* (2006.01)
  *G05B 19/418* (2006.01)
  *G06F 11/34* (2006.01)
  *G06F 11/30* (2006.01)

(52) U.S. Cl.
  CPC ........ *G06F 11/348* (2013.01); *G06F 11/3466* (2013.01); *G06F 11/3476* (2013.01); *G06F 13/4022* (2013.01); *G06F 13/4027* (2013.01); *H05K 13/0882* (2018.08); *H05K 13/0895* (2018.08); *G06F 2201/86* (2013.01); *G06F 2201/865* (2013.01); *G06F 2201/88* (2013.01)

(58) Field of Classification Search
  CPC .............. G06F 11/348; G06F 13/4022; G06F 13/4027; G06F 2201/86; G06F 2201/865; G06F 2201/88; G05B 19/418; H05K 13/0882; H05K 13/0895
  See application file for complete search history.

(56) References Cited

U.S. PATENT DOCUMENTS

| | | | |
|---|---|---|---|
| 8,776,071 B2 * | 7/2014 | Inoue | G06F 11/3024 718/100 |
| 2002/0178578 A1 | 12/2002 | Okamoto et al. | |
| 2011/0231000 A1 | 9/2011 | Higashi et al. | |

FOREIGN PATENT DOCUMENTS

| | | | |
|---|---|---|---|
| JP | 7-192059 A | 7/1995 |
| JP | 2000-141187 A | 5/2000 |
| WO | WO 01/04711 A1 | 1/2001 |

* cited by examiner

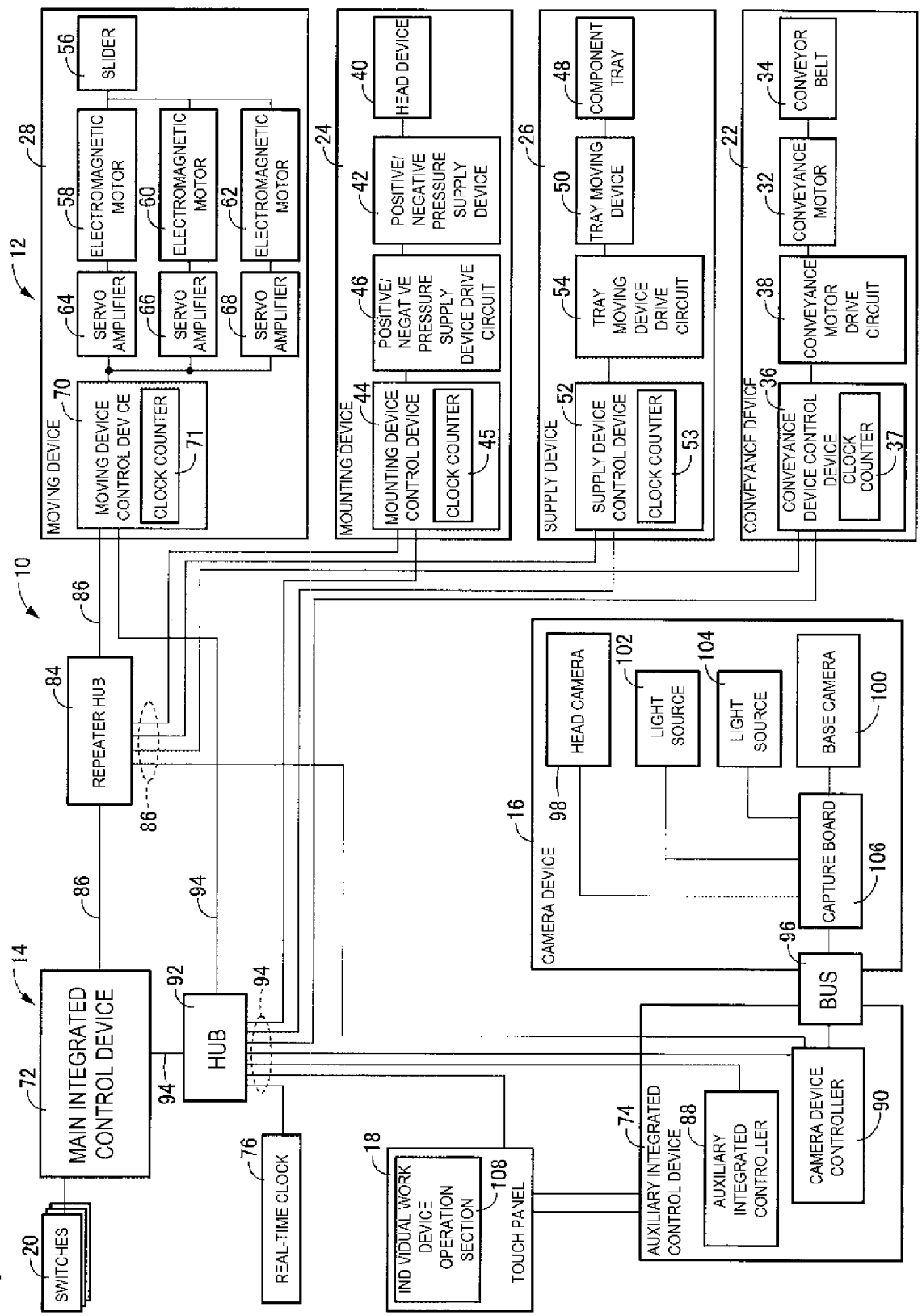
[FIG. 1]

[FIG. 2]
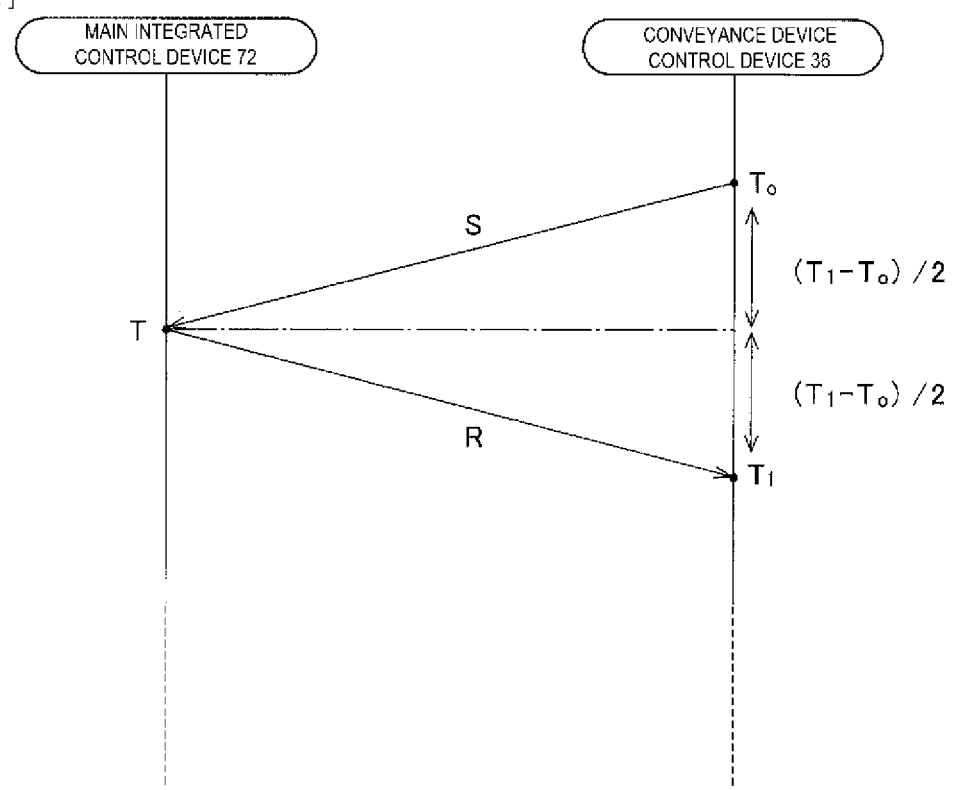

[FIG. 3]
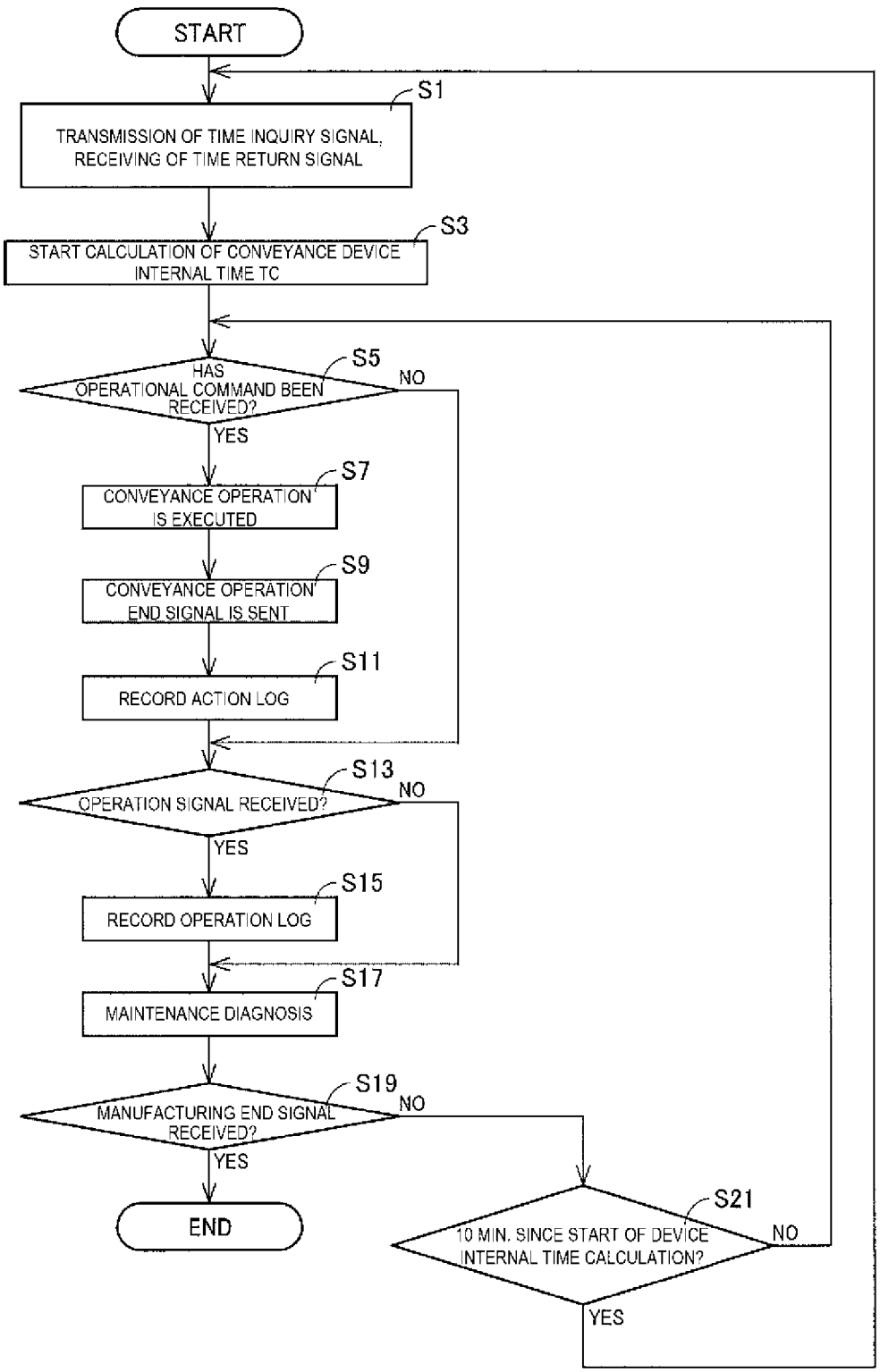

[FIG. 4]
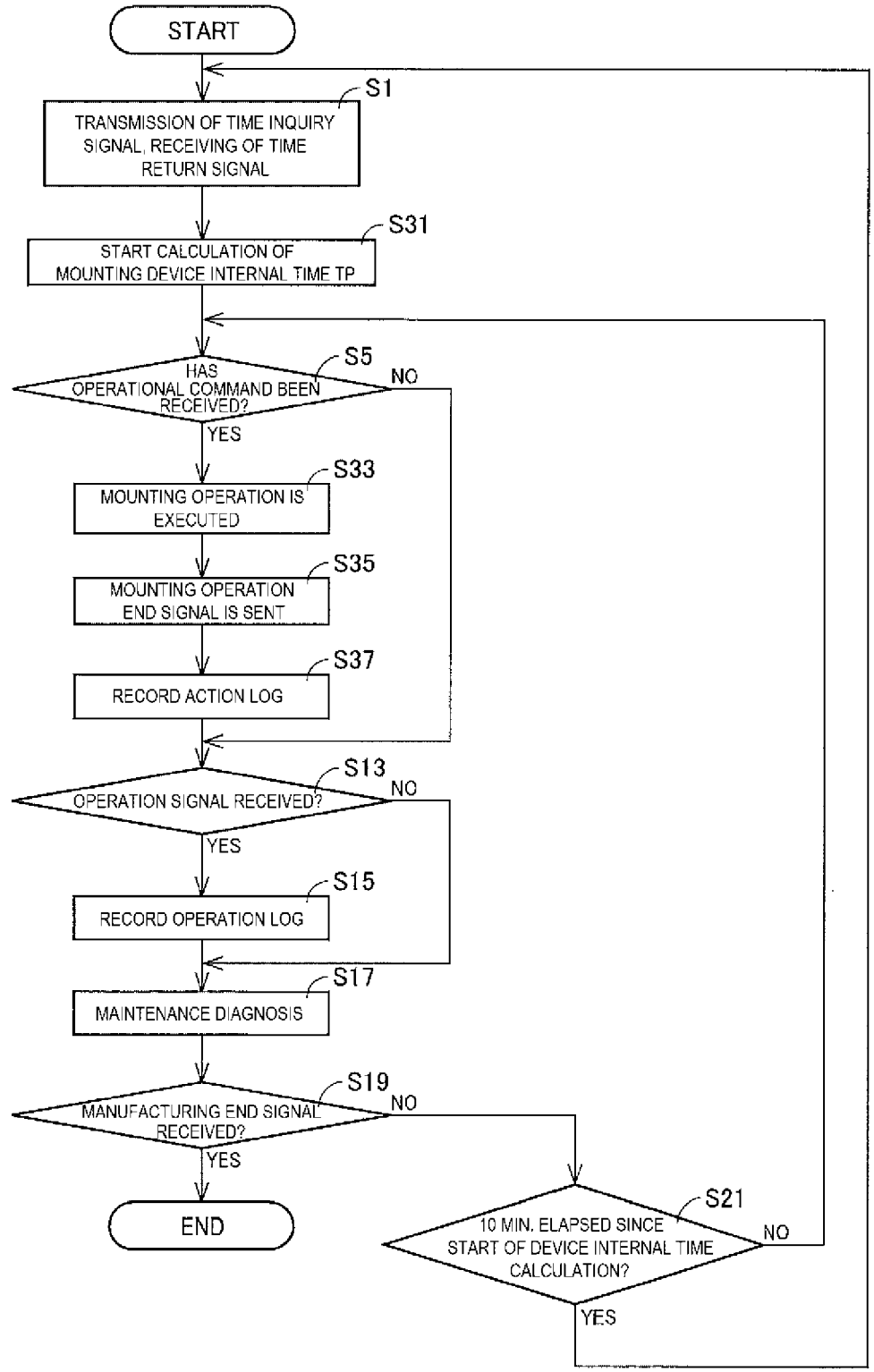

[FIG. 5]
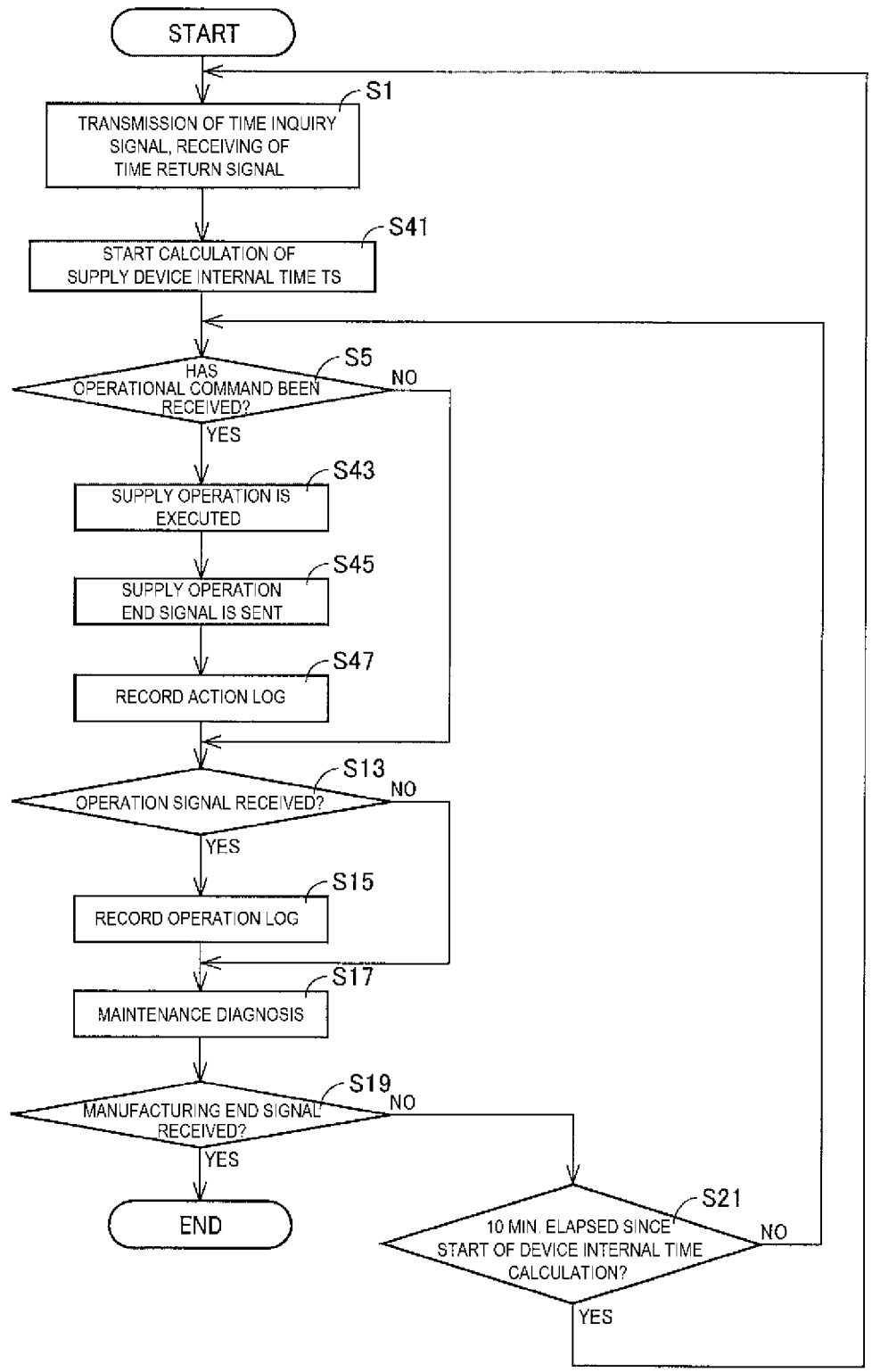

[FIG. 6]
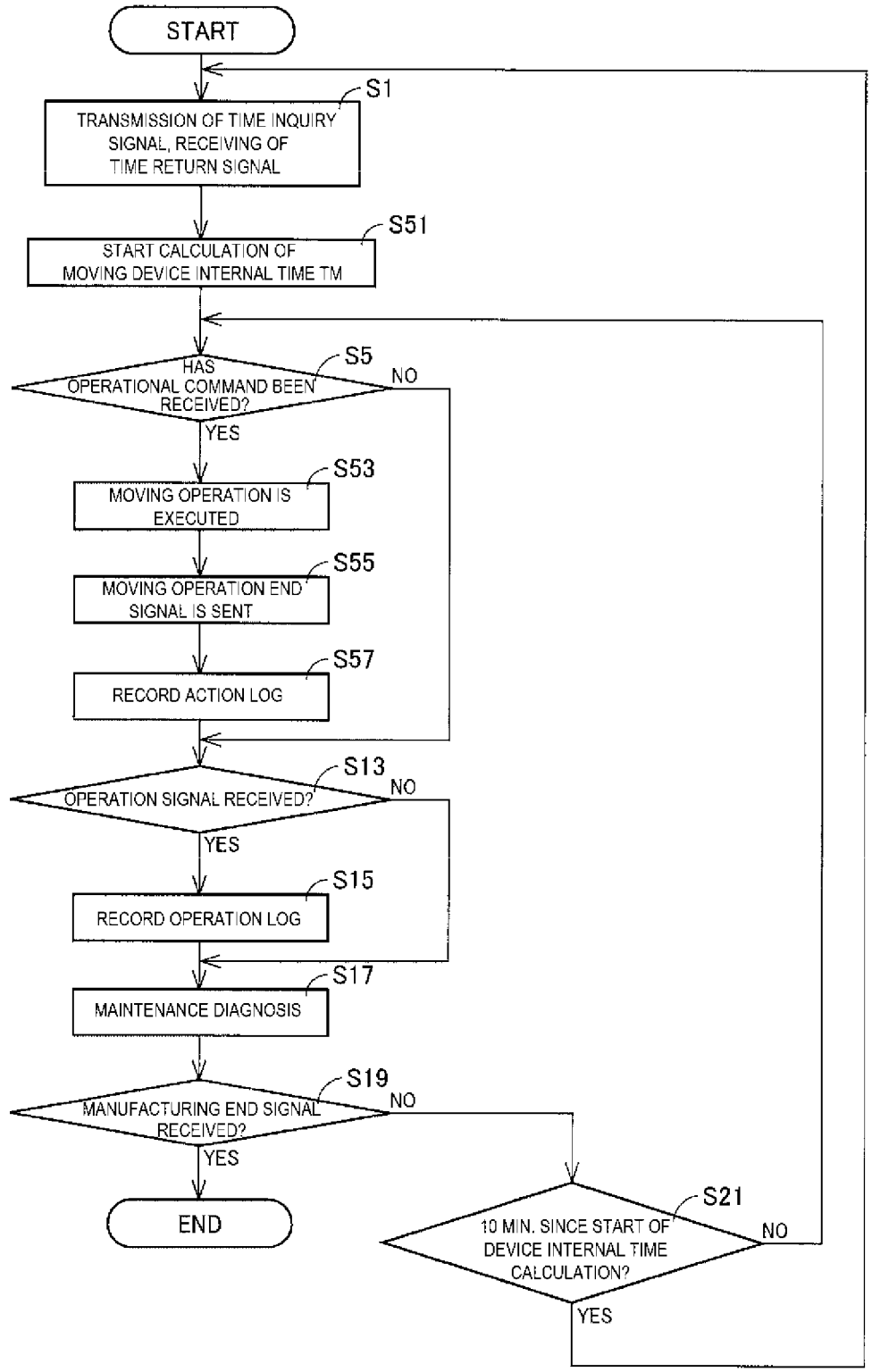

[FIG. 7]
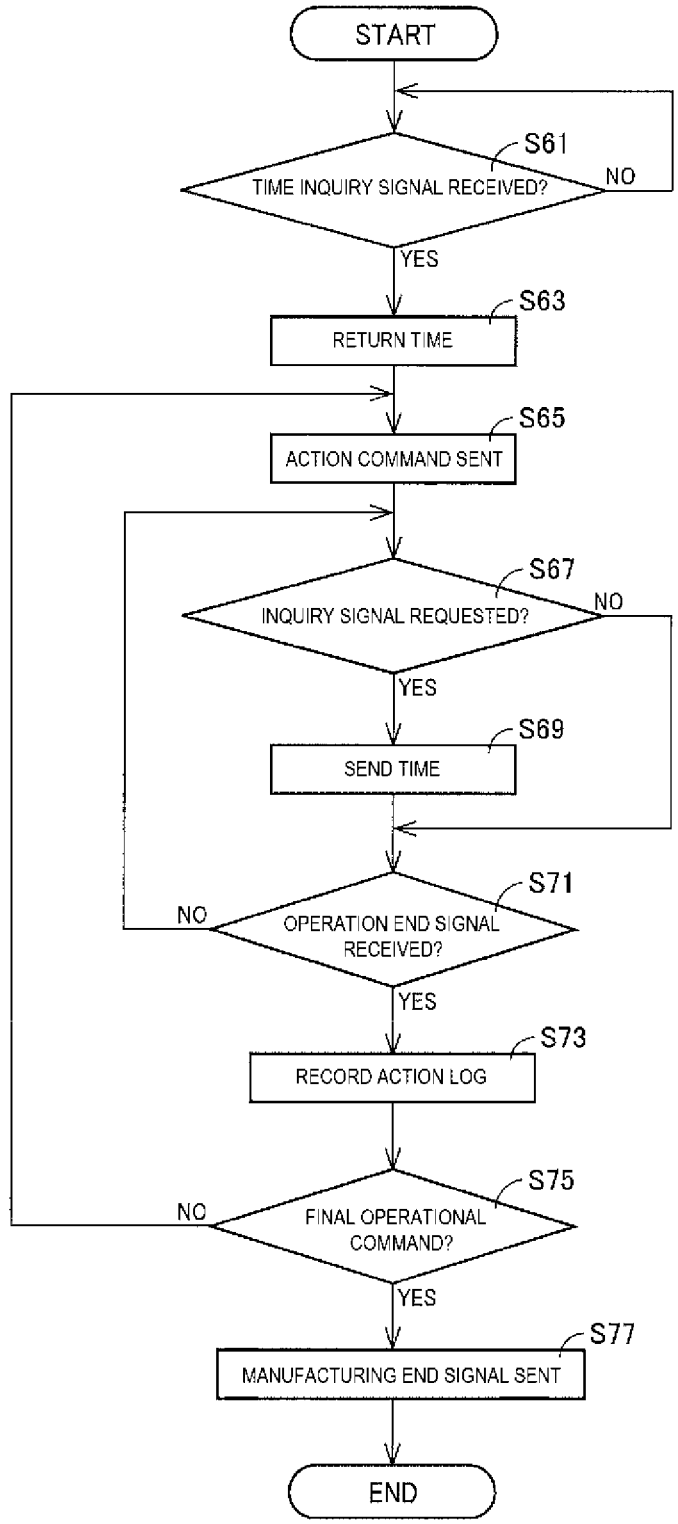

WORK DEVICE AND TIME-MEASURING METHOD OF WORK DEVICE

TECHNICAL FIELD

The present application relates to a work device including multiple working devices for performing a sequence of multiple tasks.

BACKGROUND ART

Patent Literature 1 describes a work device in which multiple devices, each having an internal clock, and a central processing unit having a clock are connected via a communication unit. Patent literature 2 describes a work device in which an operation monitoring device having a master time output unit and multiple control devices for line devices, each having an independent time output unit, are connected via a communication unit.

PATENT LITERATURE

Patent Literature 1: JP-A-Hei07-192059
Patent Literature 2: JP-A-2000-141187

BRIEF SUMMARY

Technical Problem

In a work device composed of multiple work devices configured to be controlled by a single integrated control device, there are cases in which the individual control device corresponding to the individual work device does not measure time. In such cases, it is difficult to compare action logs of the multiple working devices.

It is an object of the present disclosure to enable measurement of time in multiple control devices which respectively control multiple work devices.

Solution to Problem

In order to solve the above-mentioned problems, a work device of the present disclosure comprises: a first control device that has a first time-measuring unit for measuring elapsed time and controls a first work device for performing one of a sequence of multiple operations; a second control device that has a second time-measuring unit for measuring elapsed time and controls a second work device for performing one of a sequence of multiple operations; a third control device that has a reference time-measuring unit for measuring a reference time and transmits a command to the first control device and the second control device; and a communication unit that enables communication between the first, second, and third control devices; wherein the first control device and the second control device acquire the reference time of the third control device via the communication unit and measure times in the first and second control devices, respectively, using the acquired reference time as a starting point.

In the work device, the first control device and the second control device may measure the times in the first and second control devices, respectively, taking into account a time taken to acquire the reference time.

With the above configuration, the time in the first device and the time in the second device become substantially the same as the reference time.

In the work device, the first control device and the second control device may record action logs of the first work device and the second work device, respectively, based on the times measured in the first and second control devices.

With the above configuration, since the time in the first device and the time in the second device are substantially the same time, the relationship between the operation of the first work device and the operation of the second work device can be analyzed by comparing the recorded action log of each device.

Further, in the work device, the first and second control devices may record operation logs for the first and second work devices, respectively, based on the time measured in the first and second control devices.

With the above configuration, since the time in the first control device and the time in the second control device are substantially the same time, the operation logs of the first work device and the second work device can be compared.

In the work device, the first control device and the second control device may respectively determine when maintenance of the first work device and the second work device are required based on the time in the first control device and the time in the second control device, respectively.

With the above-described configuration, the first control device and the second control device can respectively measure the time in the first control device and the time in the second control device based on the reference time, thereby enabling determination of whether a predetermined time for performing maintenance has been reached.

In order to solve the above-mentioned problems, in the present disclosure, a time-measuring method includes a work device, the work device comprising: a first control device, having a first time-measuring unit for measuring elapsed time, configured to control a first work device for performing one of a sequence of multiple tasks; a second control device, having a second time-measuring unit for measuring elapsed time, configured to control a second work device for performing one of the sequence of operations; a third control device, having a reference time measuring unit for measuring a reference time, configured to create a command to the first control device and the second control device; and a communication unit, for enabling communication between the first control device, the second control device, and the third control device; wherein the first control device and the second control device acquire the reference time of the third control device via the communication unit and measure times in the first and second control devices, respectively, using the acquired reference time as a starting point.

Advantageous Effects

The first control device and the second control device can each measure time based on the reference time acquired from the third control device.

BRIEF DESCRIPTION OF DRAWINGS

FIG. 1 is a diagram showing an overall configuration of a circuit board manufacturing work device of a first embodiment.

FIG. 2 is a diagram showing a time-setting method of a conveyance device control device of the first embodiment.

FIG. 3 is a flowchart executed by the conveyance device of the first embodiment.

FIG. 4 is a flowchart executed by a mounting device of the first embodiment.

FIG. 5 is a flowchart executed in a supply device of the first embodiment.

FIG. 6 is a flowchart executed by a moving device of the first embodiment.

FIG. 7 is a flowchart executed by a main integrated control device of the first embodiment.

DESCRIPTION OF EMBODIMENTS

Hereinafter, an embodiment of the present disclosure will be described in detail with reference to the drawings.

<Overall Configuration of Circuit Board Manufacturing Work Device>

FIG. 1 shows an overall configuration of circuit board manufacturing work device 10 of a first embodiment of the present disclosure. Circuit board manufacturing work device 10 performs an operation for assembling an electronic circuit component (i.e., a circuit board assembling operation) for a circuit board. Circuit board manufacturing work device 10 includes four individual work devices 12 for performing multiple operations constituting a circuit board assembling operation, integrated control device 14 for unifying and controlling four individual work devices 12, camera device 16, touch panel 18, and multiple switches 20.

[Four Individual Work Devices 12]

Four individual work devices 12 are composed of conveyance device 22, mounting device 24, supply device 26, and moving device 28. Conveyance device control device 36, mounting device control device 44, supply device control device 52, and moving device control device 70, which are control devices for four individual work devices 12, each includes clock counters 37, 45, 53, 71 for measuring the elapsed time from a predetermined timing.

Conveyance device 22 includes conveyance motor 32, conveyor belt 34, conveyance device control device 36, and conveyance motor drive circuit 38. Conveyance device control device 36 includes a CPU, ROM, RAM, a communication interface, and the like, and performs various control operations by executing programs, recorded in the ROM, in the CPU. Mounting device control device 44, supply device control device 52, moving device control device 70, and main integrated control device 72, which will be described later, are also configured in the same manner as conveyance device control device 36. Conveyance device 22 carries the circuit board placed on conveyor belt 34 into a specific work position by rotating conveyor belt 34 with conveyance motor 32, and carries out the circuit board after work on the circuit board is completed. The operation of conveyance motor 32 is controlled by conveyance device control device 36 via conveyance motor drive circuit 38.

Mounting device 24 includes head device 40, positive/negative pressure supply device 42, mounting device control device 44, and positive/negative pressure supply device drive circuit 46. Head device 40 is connected to a negative pressure passage and a positive pressure passage (not shown) via positive/negative pressure supply device 42. When positive/negative pressure supply device 42 supplies negative pressure to head device 40, head device 40 picks up components to be assembled to the circuit board, and when positive/negative pressure supply device 42 supplies positive pressure to head device 40 at a predetermined position, the picked up components are released. The operation of positive/negative pressure supply device 42 is controlled by mounting device control device 44 via the positive/negative pressure supply device drive circuit 46.

Supply device 26 is a tray-unit type supply device, and includes multiple component trays 48, tray moving device 50, supply device control device 52, and tray moving device drive circuit 54. Supply device 26 moves any one of multiple component trays 48 to a position where component tray 48 can be supplied to mounting device 24. The operation of tray moving device 50 is controlled by supply device control device 52 via tray moving device drive circuit 54.

Moving device 28 is an XYZ robot type moving device, and includes slider 56, which supports mounting device 24, electromagnetic motors 58, 60, 62, servo amplifiers 64, 66, 68, and moving device control device 70. Electromagnetic motor 58 slides slider 56 in the X-axis direction (i.e., the direction in which conveyor belt 34 rotates), electromagnetic motor 60 slides slider 56 in the Y-axis direction (i.e., the direction perpendicular to the X-axis direction), and electromagnetic motor 62 slides slider 56 in the Z-axis direction (i.e., the direction perpendicular to the XY plane). Moving device 28 moves mounting device 24 provided on slider 56 to any position by operation of electromagnetic motors 58, 60, 62. Operation of electromagnetic motors 58, 60, 62 is controlled by moving device control device 70 via servo amplifiers 64, 66, 68, which transmit drive signals to each.

The circuit board assembling operation performed by circuit board manufacturing work device 10 corresponds to a sequence of multiple operations; each of conveyance device 22, mounting device 24, supply device 26, and moving device 28 correspond to a first work device or a second work device; each of conveyance device control device 36, mounting device control device 44, supply device control device 52, and moving device control device 70 correspond to a first control device or a second control device; and each of clock counters 37, 45, 53, 71 correspond to a first time-measuring unit or a second time-measuring unit.

[Integrated Control Device 14]

Integrated control device 14 includes main integrated control device 72, auxiliary integrated control device 74, and real-time clock 76. Main integrated control device 72 is connected to conveyance device control device 36, mounting device control device 44, supply device control device 52, moving device control device 70, and camera device controller 90 which will be described later, by the same type of serial communication cable 86 via repeater hub 84, and transmits operational commands to the respective control devices of four individual work devices 12.

Auxiliary integrated control device 74 includes auxiliary integrated controller 88 and camera device controller 90. Auxiliary integrated controller 88 stores source data for generating operational commands to four individual work devices 12. The source data consists of the encoded actions of four individual work devices 12. Auxiliary integrated controller 88 is connected to main integrated control device 72 via LAN cable 94 via hub 92, and transmits an operational command generated by compiling source data into a specific programming language to main integrated control device 72. Camera device controller 90 is connected to camera device 16, which will be described later, via bus 96.

Real-time clock 76 measures calendar time (i.e., the time including information of year, month, day of the month, day of the week, hour, minute, and second). Integrated control device 14 corresponds to a third control device, and real-time clock 76 corresponds to a reference time measuring unit.

[Camera Device 16]

Camera device 16 includes head camera 98 and base camera 100, light source 102 of head camera 98, light source 104 of base camera 100, and capture board 106. Head camera 98 captures an image of the circuit board mounted on conveyance device 22, and base camera 100 captures an image of the component picked up by mounting device 24. Head camera 98, base camera 100, light source 102, and light source 104 are controlled by camera device controller 90 via capture board 106 and bus 96.

[Touch Panel 18]

Touch panel 18 is connected to main integrated control device 72 and auxiliary integrated control device 74, and can input and output information related to operation of circuit board manufacturing work device 10. Touch panel 18 is provided with individual work device operation section 108 that allows an operator to operate four individual work devices 12. Operation by the operator includes setting the movable areas of four individual work devices 12, cleaning operations, and the like.

[Multiple Switches 20]

Multiple switches 20 include a main power switch, an activation switch, and the like, and are connected to main integrated control device 72. When multiple switches 20 are turned on, integrated control device 14 and four individual work devices 12 are activated.

<Operation of Circuit Board Manufacturing Work Device 10>

The circuit board assembling operation is executed with a combination of operational commands for multiple operations constituting the circuit board assembling operation. Main integrated control device 72 transmits an operational command for one of four individual work devices 12 to one of four individual work devices 12 via serial communication cable 86. Since the operational command includes a code specifying one of four individual work devices 12 that performs the operation, only one of four individual work devices 12 starts operation. The control device of one of four individual work devices 12 specified by the operational command compiles the operational command into a programming language that can be used by the control device itself, and then executes an instructed operation based on the compiled operational command. When the instructed operation is completed, one of four individual work devices 12 that performed the operation transmits a reply regarding completion of the operation to the main integrated control device 72 via serial communication cable 86. Main integrated control device 72 confirms that the operational command has been completed by receiving a reply regarding completion of the work. Then, the next operational command is transmitted. Subsequent operations are performed by repeating the same steps.

<Method for Setting the Time for Four Individual Work Devices 12>

Four individual work devices 12 have a clock counter, but since the clock counter cannot measure calendar time, the clock counter is configured to measure the time based on calendar time obtained from integrated control device 14. Although each of four individual work devices 12 performs time setting in the same manner, a time setting method of conveyance device 22, which is one of four individual work devices 12, will be described with reference to FIG. 2. FIG. 2 is a diagram showing the relationship of the process (i.e., the time-setting process) executed to set the time of conveyance device control device 36 based on the time of integrated control device 14.

As shown in FIG. 2, first, at time $T_o$, conveyance device control device 36 transmits time inquiry signal S to main integrated control device 72. At this time, measurement of the elapsed time is started by clock counter 37. Next, main integrated control device 72 receives time inquiry signal S and acquires the time of real-time clock 76 at time T. Main integrated control device 72 transmits time T to conveyance device control device 36 as time return signal R. Conveyance device control device 36 receives time return signal R at time $T_1$.

Time $T_1$, at which conveyance device control device 36 receives time reply signal R, is the time at which the time required to transmit time reply signal R has elapsed from time T. Accordingly, conveyance device control device 36 calculates the transmission time of time reply signal R in order to calculate time $T_1$. Assuming that the transmission time of time inquiry signal S and the transmission time of time reply signal R are the same, the transmission time of time reply signal R is represented by $(T_1-T_o)/2$ using elapsed time $T_1-T_o$ from time $T_o$ to time $T_1$. Therefore, time $T_1$ can be obtained by calculating $T+(T_1-T_o)/2$.

Conveyance device control device 36 measures the elapsed time from calculated time $T_1$ with clock counter 37 and calculates the time to be used in conveyance device 22. The time calculated in this manner is defined as time TC in conveyance device 22. As a result, conveyance device control device 36 can increment at substantially the same time as the calendar time of integrated control device 14.

<Operation in Conveyance Device 22>

FIG. 3 is a flowchart executed in conveyance device 22 when conveyance device 22 is activated. When conveyance device 22 and integrated control device 14 are activated, conveyance device control device 36 first executes step 1 (hereinafter, simply abbreviated as "S1". The same applies to other steps). In S1, as shown in FIG. 2, conveyance device control device 36 transmits time inquiry signal S to main integrated control device 72 via serial communication cable 86. Conveyance device control device 36 receives time T from main integrated control device 72 at time $T_1$, adds the transmission time to time T, and calculates time $T_1$. In S3, conveyance device control device 36 starts the calculation of conveyance device internal time TC with time $T_1$ calculated in S1 as a starting point.

In S5, conveyance device control device 36 determines whether the operational command transmitted from main integrated control device 72 has been received. If the operational command is received, the process proceeds to S7, and if the operational command is not received, the process proceeds to S13. In S7, conveyance device control device 36 transmits a signal to conveyance motor drive circuit 38 based on the operational command to drive conveyance motor 32. Conveyance motor 32 rotates conveyor belt 34 to move the circuit board placed on conveyor belt 34 to a predetermined position. When the conveyance operation of the circuit board is completed, in S9, conveyance device control device 36 transmits a conveyance operation end signal to main integrated control device 72.

In S11, conveyance device control device 36 links and records, as an action log, the operation of conveyance device 22 executed in S7 and the time at which the operation was performed based on time TC in conveyance device 22. Next, in S13, conveyance device control device 36 determines whether an operation signal transmitted by the operator operating individual work device operation section 108 has been received. If the operation signal has been received, the process proceeds to S15, and if the operation signal has not been received, the process proceeds to S17. In S15, the conveyance device control device 36 links and records, as an operation log, the operation of conveyance device 22 executed by the operator and the time based on time TC in conveyance device 22 at the time the operation was performed. In S17, conveyance device control device 36 determines whether the time at which S17 is executed based on conveyance device internal time TC has reached a predetermined maintenance time stored in advance in the ROM of conveyance device control device 36, and when the maintenance time has come, transmits a signal indicating that conveyance device 22 has reached the maintenance time to main integrated control device 72.

In S19, the conveyance device control device 36 determines whether a manufacturing end signal has been received. The manufacturing end signal is transmitted from main integrated control device 72 to all four individual work devices 12 after the operation according to the final operational command of the sequence of operational commands created for performing the circuit board assembly work is completed. If the manufacturing end signal is not received in S19, the process proceeds to S21, and if the manufacturing end signal is received, the process of the flowchart ends. In S21, conveyance device control device 36 determines whether the elapsed time measured by clock counter 37 from the start of the calculation of conveyance device internal time TC currently being calculated has reached 10 minutes. If the elapsed time is 10 minutes or more, the process proceeds to S1, and if the elapsed time is less than 10 minutes, the process proceeds to S5. The predetermined elapsed time determined in S21 is not limited to 10 minutes, and may be set to any other time.

<Operation of Mounting Device 24>

FIG. 4 is a flowchart executed in mounting device 24 when mounting device 24 is activated. Here, description of the same process as that of conveyance device 22 is omitted, and a process different from that of conveyance device 22 will be described. In S31, mounting device control device 44 starts the calculation of time TP, which is the time used in mounting device 24, by clock counter 45 with time T1 as a starting point.

In S33, mounting device control device 44 sends a signal to positive/negative pressure supply device drive circuit 46 based on the operational command to drive positive/negative pressure supply device 42. When the mounting operation is completed, in S35, mounting device control device 44 transmits a mounting operation end signal to main integrated control device 72. In S37, mounting device control device 44 links and records, as an action log, the operations performed in the mounting operation and the time at which the operation was performed based on mounting device internal time TP.

<Operation of Supply Device 26>

FIG. 5 is a flowchart executed in supply device 26 when supply device 26 is activated. Here, description of the same process as that of conveyance device 22 is omitted, and a process different from that of conveyance device 22 will be described. In S41, supply device control device 52 starts the calculation of the supply device internal time TS, which is the time used in supply device 26, by clock counter 53 with the time at time T1 as a starting point.

In S43, supply device control device 52 sends a signal to tray moving device drive circuit 54 based on the operational command to drive tray moving device 50. Tray moving device 50 moves one of multiple component trays 48 to a predetermined position. When the supply operation is completed, in S45, supply device control device 52 transmits a supply operation completion signal to main integrated control device 72. In S47, supply device control device 52 links and records, as an action log, the operation performed in the supply operation and the time at which the operation was performed based on supply device internal time TS.

<Operation of Moving Device 28>

FIG. 6 is a flowchart executed in moving device 28 when moving device 28 is activated. Here, description of the same process as that of conveyance device 22 is omitted, and a process different from that of conveyance device 22 will be described. In S51, moving device control device 70 starts calculating in-moving device time TM, which is the time used in moving device 28, by clock counter 71 with the time at time T1 as a starting point.

In S53, moving device control device 70 sends a signal to servo amplifiers 64, 66, 68 based on the operational command to operate electromagnetic motors 58, 60, 62, respectively. Electromagnetic motors 58, 60, 62 move slider 56 in the X-axis, Y-axis, and Z-axis directions, respectively, to move slider 56 to predetermined positions. When the conveyance operation is completed, in S55, moving device control device 70 transmits a conveyance operation end signal to main integrated control device 72. In S57, moving device control device 70 records the operation performed in the moving operation in association with the time at which the operation was performed based on time TM in the moving device as an action log.

Time TC in conveyance device 22, time TP in mounting device 24, time TS in supply device 26, and time TM in moving device 28 each correspond to the time in the first device or the time in the second device.

<Operation of Main Integrated Control Device 72>

FIG. 7 is a flowchart executed by main integrated control device 72 when main integrated control device 72 is activated. When four individual work devices 12 and integrated control device 14 are activated, main integrated control device 72 determines in S61 whether time inquiry signal S transmitted from any of four individual work devices 12 has been received. When time inquiry signal S is received, the process proceeds to S63, and when time inquiry signal S is not received, S61 is repeated.

In S63, as shown in FIG. 2, main integrated control device 72 obtains the time of real-time clock 76 at time T at which time inquiry signal S is received and returns the acquired time to one of four individual work devices 12 to which time inquiry signal S is transmitted. In S65, main integrated control device 72 transmits a sequence of operational command groups to four individual work devices 12 in order from the first operational command. A sequence of operational command groups are prepared in advance by an operator using multiple operational commands for executing multiple operations constituting a circuit board assembly operation.

Next, in S67, it is determined whether main integrated control device 72 has received time inquiry signal S, and if time inquiry signal S has been received, the process proceeds to S69, and if time inquiry signal S has not been received, the process proceeds to S71. In S71, main integrated control device 72 determines whether an operation end signal has been received from one of four individual work devices 12 that is executing an operation. If the operation end signal is not received, the process proceeds to S67, and if the operation end signal is received, the process proceeds to S73.

In S73, main integrated control device 72 records the operation relating to the transmission of the operational command and the reception of the operation end signal as an action log together with the time based on the calendar time of integrated control device 14 at the time when the operation is performed. In S75, main integrated control device 72 determines whether the transmitted operational command is the final operational command of the sequence of operational command groups. If the transmitted operational command is not the final operational command, the process proceeds to S65, and if the transmitted operational command is the final operational command, the process proceeds to S77. In S77, main integrated control device 72 transmits a manufacturing end signal to all four individual work devices 12. After the end of S77, the process of to the flowchart ends.

As described above, in the present embodiment, each of the control devices of four individual work devices 12 acquires the time of integrated control device 14, and the time of each of the control devices of four individual work devices 12 is measured based on the obtained time. Therefore, it is possible to measure the time in each of four individual work devices 12.

Further, in the time setting process, since each of the control devices of four individual work devices 12 calculates the time while taking into consideration the transmission time required to obtain the time of integrated control device 14, it is possible to set the time substantially the same as the time of integrated control device 14.

Four individual work devices 12 measure substantially the same time, and link and record the executed operation and the time when the operation is performed. Therefore, for example, in the case of analyzing the log of conveyance device 22 and the log of mounting device 24, since time TC in the conveyance device and time TP in the mounting device indicate the same time, the relationship between the action log of conveyance device 22 recorded based on time TC in the conveyance device and the action log of mounting device 24 recorded based on time TP in the mounting device can be compared and analyzed.

Four individual work devices 12 record action logs based on the in-device time in the same manner as the operation logs for the operations performed on four individual work devices 12. Therefore, the operator can compare and analyze the operation logs of each of four individual work devices 12 in addition to the action logs.

Each of four individual work devices 12 has a unit for measuring the time, based on calendar time, so that it is possible to determine whether a predetermined maintenance time has been reached, and when the maintenance time has come, it is possible to notify the operator of the need for maintenance via integrated control device 14.

Each of four individual work devices 12 records a log based on the in-device time, which is substantially the same time as main integrated control device 72. Therefore, it is possible to compare the log recorded in one of four individual work devices 12 with the log recorded in main integrated control device 72. Thus, for example, when comparing the logs of main integrated control device 72 and conveyance device 22, the log to which the operational command for conveyance device 22 is transmitted is recorded in main integrated control device 72, but it can be recognized that the action log corresponding to the transmitted operational command is not recorded in conveyance device 22 at the time the log to which the operational command is transmitted is recorded. In such a case, the operator can specify there has been an unintended reboot or shutdown in conveyance device 22.

REFERENCE SIGNS LIST

10: Circuit board manufacturing work device 12: Individual work device 14: Integrated control device 16: Camera device 18: Touch panel 20: Multiple switches 22: Conveyance device 24: Mounting device 26: Supply device 28: Moving device 32: Conveyance motor 34: Conveyor belt 36: Conveyance device control device 37: Clock counter 38: Transport motor drive circuit 40: Head device 42: Positive/negative pressure supply device: 44: Mounting device control device 45: Clock counter 46: Positive/negative pressure supply device drive circuit 48: Component tray 50: Tray moving device: 52: Supply device control device 53: Clock counter 54: Tray moving device drive circuit 56: Slider 58: Electromagnetic motor 60: Electromagnetic motor 62: Electromagnetic motor 64: Servo amplifier 66: Servo amplifier 68: Servo amplifier 70: Moving device control device 71: Clock counter 72: Main integrated control device 74: Auxiliary integrated control device 76: Real-time clock 84: Repeater hub 86: Serial communication cable 88: Auxiliary integrated controller 90: Camera device controller 92: Hub 94: LAN cable 96: Bus 98: Head camera 100: Base camera 102: Light source 104: Light source 106: Capture board 108: Individual work device operation section

The invention claimed is:

1. A work device, comprising:
    a first control device, having a first time-measuring unit for measuring elapsed time, for controlling a first work device for performing one of a sequence of multiple tasks;
    a second control device, having a second time-measuring unit for measuring elapsed time, for controlling a second work device for performing one of the sequence of operations;
    a third control device, having a reference time-measuring unit for measuring a reference time, for transmitting commands to the first control device and the second control device; and
    a communication unit, for enabling communication between the first control device, the second control device, and the third control device;
    wherein the first control device and the second control device
    acquire the reference time of the third control device via the communication unit and measure times in the first and second control devices, respectively, using the acquired reference time as a starting point.

2. The work device according to claim 1, wherein the first control device and the second control device measure the time in the first control device and the time in the second control device, respectively, taking into account a time taken to acquire the reference time.

3. The work device according to claim 1, wherein the first control device and the second control device each record an action log by the first work device and the second work device, respectively, based on the time in the first control device and the time in the second control device.

4. The work device according to claim 1, wherein the first control device and the second control device each record a log of operations performed on the first work device and the second work device, respectively, based on the time in the first control device and the time in the second control device.

5. The work device according to claim 1, wherein the first control device and the second control device determine when maintenance of the first work device and the second work device is required, respectively, based on the time in the first control device and the time in the second control device.

6. A time-measuring method of a work device, the work device comprising:
- a first control device, having a first time-measuring unit for measuring elapsed time, configured to control a first work device for performing one of a sequence of multiple tasks;
- a second control device, having a second time-measuring unit for measuring elapsed time, configured to control a second work device for performing one of the sequence of operations;
- a third control device, having a reference time measuring unit for measuring a reference time, configured to create a command to the first control device and the second control device; and
- a communication unit, for enabling communication between the first control device, the second control device, and the third control device;

the time-measuring method, comprising:
- a step of causing the first control device and the second control device to acquire the reference time of the third control device via the communication unit, and
- a step of causing the first control device and the second control device to measure a time in the first control device and a time in the second control device with the acquired reference time as a starting point.

* * * * *